(12) United States Patent
Uetake et al.

(10) Patent No.: US 7,456,422 B2
(45) Date of Patent: Nov. 25, 2008

(54) SEMICONDUCTOR DEVICE

(75) Inventors: Ayahito Uetake, Kawasaki (JP); Hiroji Ebe, Tokyo (JP); Kenichi Kawaguchi, Kawasaki (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 106 days.

(21) Appl. No.: 11/366,597

(22) Filed: Mar. 3, 2006

(65) Prior Publication Data

US 2006/0220001 A1    Oct. 5, 2006

(30) Foreign Application Priority Data

Mar. 4, 2005    (JP)    ............... 2005-060186

(51) Int. Cl.
  *H01L 29/06*    (2006.01)
  *H01L 31/00*    (2006.01)
(52) U.S. Cl. ............... 257/14; 257/9; 257/15; 257/200
(58) Field of Classification Search .......... 257/14, 257/15, 414
  See application file for complete search history.

(56) References Cited

U.S. PATENT DOCUMENTS

| | | | |
|---|---|---|---|
| 5,719,894 A | 2/1998 | Jewell et al. | ............ 372/45 |
| 6,992,320 B2* | 1/2006 | Ebe et al. | ............ 257/21 |
| 7,015,498 B2* | 3/2006 | Ebe et al. | ............ 257/14 |
| 7,101,444 B2* | 9/2006 | Shchukin et al. | ............ 148/33 |
| 2003/0073258 A1* | 4/2003 | Mukai et al. | ............ 438/29 |
| 2004/0038440 A1* | 2/2004 | Hatori | ............ 438/47 |
| 2004/0041145 A1* | 3/2004 | Ebe et al. | ............ 257/14 |
| 2004/0099858 A1* | 5/2004 | Lee | ............ 257/13 |
| 2004/0124409 A1 | 7/2004 | Ebe et al. | |
| 2005/0045868 A1 | 3/2005 | Otsubo et al. | ............ 257/14 |

FOREIGN PATENT DOCUMENTS

JP    2004-111710    4/2004

OTHER PUBLICATIONS

Official Communication from German Patent Office mailed Dec. 4, 2006 with English translation (7 pages).
Correspondence received from the German Patent Office mailed Apr. 30, 2008 with English translation (7 pages).

\* cited by examiner

*Primary Examiner*—Zandra Smith
*Assistant Examiner*—Telly D Green
(74) *Attorney, Agent, or Firm*—Kratz, Quintos & Hanson

(57) ABSTRACT

A semiconductor device including quantum dots comprises a barrier layer of a semiconductor crystal having a first lattice constant and a quantum dot layer including a plurality of quantum dots of a semiconductor crystal having a second lattice constant formed on the barrier layer and a side barrier layer of a semiconductor crystal having a third lattice constant, which is formed in contact with the side faces of the plurality of quantum dots, in which the barrier layer, the quantum dots and the side barrier layer are configured so that the difference between the values of the first lattice constant and the second lattice constant has a sign opposite to that of the difference between values of the first lattice constant and the third lattice constant.

5 Claims, 2 Drawing Sheets

SEMICONDUCTOR DEVICE

CROSS REFERENCE TO RELATED APPLICATIONS

This application is based on and hereby claims priority to Japanese Application No. 2005-60186 filed on Mar. 4, 2005 in Japan, the contents of which are hereby incorporated by reference.

BACKGROUND OF THE INVENTION (1) Field of the Invention

The present invention relates to a semiconductor device used in, for example, optical communication system, particularly to a semiconductor device suitably used in semiconductor optical amplifier (SOA) in which quantum dots are used in active layers.

(2) Description of Related Art

Recently, due to small size and small power consumption, semiconductor optical amplifier and semiconductor laser are spotlighted in the field of optical communication.

Particularly, since the pattern effect is small but gain band is wide, semiconductor optical amplifier, which uses quantum dots as an active layer (hereinafter, referred to as quantum dot SOA), is estimated as a device capable of amplifying the CWDM (Coarse Wavelength Division Multiplexing) signal as a batch.

To put the quantum dot SOA into practical use, in addition to the width of the gain band, the optical characteristics should be independent of the polarization of the optical signals.

With respect to this, it is known that the quantum dots can be formed by utilizing so-called S-K (Stranski-Krastanow) mode growth, which appears at the initial stage of the strain heteroepitaxial growth.

However, generally, in the quantum dots formed in such growth-mode, since the dots have a flat shape and have an anisotropic strain, the gain with respect to the transverse-electric-mode (TE-mode) sensitivity is large, and accordingly, the polarization dependency is large.

Therefore, in order to improve the polarization dependency, for example, the Japanese Patent Laid-Open (Kokai) No.2004-111710 has proposed the following; i.e., barrier layers including quantum dots are repeatedly stuck, and thereby each of the quantum dots are quantum-mechanically combined with each other (refer to paragraph number 0035, 0037, and FIG. 3). Also, the Japanese Patent Laid-Open (Kokai) No. 2004-111710 has proposed the following; i.e., by changing the composition of the barrier layer enclosing the quantum dots, the relationship between the level of light holes and the level of heavy holes in the valence band is controlled; thereby the sensitivity of the quantum dots with the transverse-magnetic-mode (TM-mode) light is controlled to be larger than the sensitivity of the quantum dots with respect to the TE-mode light (refer to paragraph number 0051).

SUMMARY OF THE INVENTION

In the quantum dots formed by a growth of self-organization as described above, since a strain is generated, the crystallinity of the barrier layers (and entire active layer) including the quantum dots is degraded.

In the case also where the barrier layers including the quantum dots are repeatedly stuck and each of the quantum dots are quantum-mechanically combined with each other as disclosed in, for example, the Japanese Patent Laid-Open (Kokai) No. 2004-111710 (refer to FIG. 3), it is important to improve the crystallinity of the barrier layer including the quantum dots.

Also, the Japanese Patent Laid-Open (Kokai) No. 2004-111710 discloses that the polarization dependency can be improved by changing the composition of the barrier layer enclosing the quantum dots. However, it is also important to improve the crystallinity of the barrier layer including the quantum dots.

On the other hand, in the case where the barrier layers including the quantum dots are repeatedly stuck as disclosed in the Japanese Patent Laid-Open (Kokai) No. 2004-111710 (refer to FIG. 3), generally, the barrier layer is formed at the upper side also of the quantum dots (here, since a plurality of barrier layers including the quantum dots are stuck, between the upper and lower quantum dots).

However, when the barrier layers are formed at the upper side also of the quantum dots, a compressive force acts on the upper side of the quantum dots resulting in an undesired effect in view of improving the polarization dependency.

The present invention has been proposed in view of the above problems. It is an object of the present invention to provide a semiconductor device in which crystallinity of an active layer including quantum dots is improved. Another object of the present invention is to improve the polarization dependency by effectively controlling the strain generated on the quantum dots.

To achieve the above objects, a semiconductor device in accordance with the present invention comprises a barrier layer of a semiconductor crystal having a first lattice constant and a quantum dot layer formed on the barrier layer including a plurality of quantum dots of a semiconductor crystal having a second lattice constant and a side barrier layer of a semiconductor crystal having a third lattice constant formed in contact with the side faces of the plurality of quantum dots, in which the barrier layer, the quantum dots and the side barrier layer are configured so that the difference between the values of the first lattice constant and the second lattice constant has a sign opposite to that of the difference between the values of the first lattice constant and the third lattice constant.

Further, the semiconductor device is preferably configured to have a plurality of the quantum dot layers, and a plurality of quantum dot layers are stuck so that the quantum dots constituting one layer are in contact with the quantum dots constituting the neighboring other layers.

Therefore, according to the semiconductor device of the present invention, an advantage that the crystallinity of the quantum dot layer including the quantum dots is improved.

Also, such an advantage that the strain generated on the quantum dots can be effectively controlled and the polarization dependency can be improved accordingly.

DESCRIPTION OF THE PREFERRED EMBODIMENTS

Now, semiconductor devices in accordance with embodiments of the invention will be described with reference to the drawings.

First embodiment

First of all, a semiconductor device in accordance with a first embodiment of the invention will be described with reference to FIG. 1 and FIG. 2.

The semiconductor device in accordance with the embodiment is, for example, a semiconductor optical amplifier (hereinafter, referred to as SOA) including active layers using quantum dots.

Figure 1:
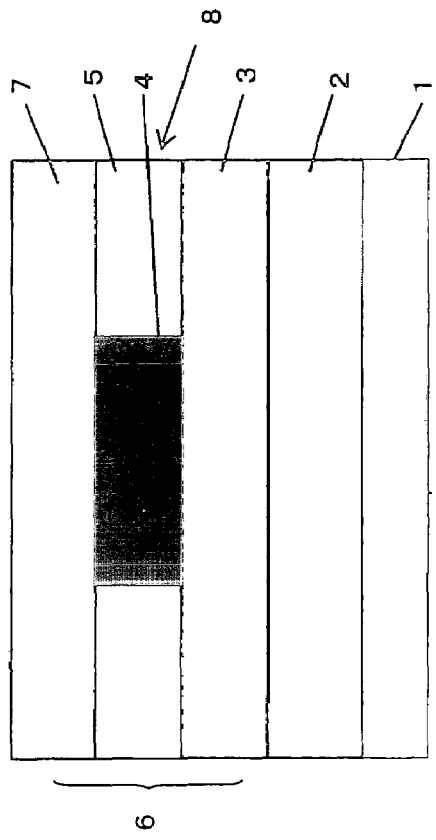
FIG. 1 is a sectional view schematically showing a structure of a semiconductor device in accordance with a first embodiment of the invention.

As shown in FIG. 1, the quantum dot SOA comprises a semiconductor substrate (here, InP substrate) 1 and an active layer 6 including quantum dots 4 formed on the semiconductor substrate 1 being interposed by a buffer layer (here, InP layer) 2.

Here, the active layer 6 comprises barrier layers 3 and 7, a plurality of quantum dots 4 and a side barrier layer 5.

A quantum dot layer 8 comprises the plurality of quantum dots 4, a side barrier layer 5 formed in contact with the side faces of the plurality of quantum dots 4. The quantum dot layer 8 is stuck on the lower barrier layer 3; and the upper barrier layer 7 is stuck on the quantum dot layer 8. Owing to this, the quantum dot layer 8 is sandwiched between the lower barrier layer 3 and the upper barrier layer 7. That is, the upper surface of the quantum dots 4 is in contact with the upper barrier layer 7 and the lower surface thereof is in contact with the lower barrier layer 3. The height of the quantum dots 4 and the thickness of the side barrier layer 5 are substantially equal to each other.

In the first embodiment, the semiconductor crystals forming the quantum dots 4, the barrier layers 3 and 7 and the side barrier layer 5 are formed of III-V compound semiconductor mixed crystals including In and Ga (here, semiconductor mixed crystals of InGaAsP) respectively. Also, the side barrier layer 5 is formed of a semiconductor crystal which strains with respect to the semiconductor crystal constituting the lower barrier layer 3.

In particular, the barrier layers 3 and 7 are InGaAsP layers of semiconductor mixed crystals (first semiconductor crystal, first lattice constant) of $In_xGa_{1-x}As_{1-y}P_y$ (range of strain: ±0.5%, range of lattice constant: 0.5869 nm±0.003 nm) being in the state of lattice matching to the InP substrate. For example, the barrier layers 3 and 7 are InGaAsP layers of $In_{0.850}Ga_{0.150}As_{0.327}P_{0.673}$ semiconductor mixed crystals (lattice constant: 0.5869 nm).

The side barrier layer 5 is a strain InGaAsP layer of a semiconductor mixed crystal (third semiconductor crystal, third lattice constant) of $In_xGa_{1-x}As_{1-y}P_y$ ($x \leq 0.84$, range of strain/tensile strain: 0.5 to 3%, range of lattice constant: 0.5698 to 0.5868 nm, range of volume ratio: 40 to 95%). For example, a strain InGaAsP layer of $In_{0.710}Ga_{0.290}As_{0.327}P_{0.673}$ semiconductor mixed crystal (lattice constant: 0.58113 nm, tensile strain: 1%, volume ratio: 75%) is formed.

Also, the quantum dots 4 are InAs quantum dots of InAs semiconductor crystal (second semiconductor crystal; lattice constant: 0.60584 nm, second lattice constant; here, compression strain: approximately 3%, volume ratio: 25%).

As described above, in this embodiment, the barrier layers 3 and 7, the quantum dots 4 and the side barrier layer 5 are controlled so that the difference between the values of the first lattice constant and the second lattice constant has a sign opposite to that of the difference between the values of the first lattice constant and the third lattice constant.

For example, when the value of the lattice constant (second lattice constant) of the semiconductor crystal constituting the quantum dots 4 is larger than the value of the lattice constant (first lattice constant) of the semiconductor crystal constituting the barrier layer 3, the value of the lattice constant (third lattice constant) of the semiconductor crystal constituting the side barrier layer 5 is controlled so as to be smaller than the value of the lattice constant (first lattice constant) of the semiconductor crystal constituting the barrier layer 3 so that the difference between the value of the first lattice constant and the value of the second lattice constant has a sign opposite to that of the difference between the values of the first lattice constant and the third lattice constant.

Preferably, the barrier layers 3 and 7, the quantum dots 4 and the side barrier layer 5 are configured so that the value of the lattice constant (first lattice constant) of the semiconductor crystal constituting the barrier layers 3 and 7 is equal to the average value of the value of the lattice constant (second lattice constant) of the semiconductor crystal constituting the quantum dots 4 and the value of the lattice constant (third lattice constant) of the semiconductor crystal constituting the side barrier layer 5.

Particularly, it is preferred that the integrated value of the difference between the values of the first lattice constant and the second lattice constant and the volume ratio of quantum dots 4 with respect to the volume of the quantum dot layer 8 be equal to the integrated value of the difference between the values of the first lattice constant and the third lattice constant and the volume ratio of the side barrier layer 5 with respect to the volume of the quantum dot layer 8.

Hereinafter, the reason of the constitution will be described.

Generally, in the quantum dots 4 formed in a manner of self-organization, since a compression strain (or tensile strain) is generated, the gain with respect to the TE-mode polarization (in case of the tensile strain, the TM-mode polarization) becomes larger resulting in a larger polarization dependency.

Therefore, in order to improve the polarization dependency, it is conceivable that a strain is added to the side barrier layer 5 in contact with the side faces of the quantum dots 4 so as to allow a tensile force (or compressive force) to act on the side face of the quantum dots 4.

On the other hand, generally, the quantum dots 4 formed by a growth of self-organization have a flat shape and the area of the side faces of the quantum dots 4 is small. Therefore, to effectively control the strain generated on the quantum dots 4, a large strain has to be added to the side barrier layer 5.

However, when a large strain is added to the side barrier layer 5, the crystallinity of the quantum dot layer 8 (active layer 6 also) becomes degraded.

Therefore, in the first embodiment, by configuring as described-above, macroscopically, the barrier layers 3 and 7 and the quantum dot layer 8 are configured so that the lattice matching is ensured; thereby the crystallinity of the quantum dot layer 8 (and entire of active layer 6 also) is improved. Also, in the first embodiment, the semiconductor crystals forming the barrier layers 3 and 7 and the side barrier layer 5 are configured in a state that the In or Ga concentration is higher in the area in the vicinity of the quantum dots 4 than that in the area other than that area.

Next, the manufacturing method of the quantum dot SOA in accordance with the first embodiment will be described.

First of all, as shown in FIG. 1, on the InP substrate 1 having (001) plane direction, the InP buffer layer 2 (for example, 100 nm in thickness) is allowed to grow up to, and then, the lower InGaAsP barrier layer 3 (for example, band gap wavelength: 1.1 μm, 100 nm in thickness) of $In_{0.850}Ga_{0.150}As_{0.327}P_{0.673}$ semiconductor mixed crystal (first semiconductor crystal, lattice constant: 0.5869 nm: first lattice constant) being in the state of lattice matching to InP (i.e., lattice constants thereof are agree with each other) in a manner of, for example, metalorganic chemical vapor deposition.

Then, on the lower barrier layer 3, the InAs quantum dots 4 of, for example, InAs semiconductor crystal (second semiconductor crystal, lattice constant: 0.60584 nm; second lattice constant; here, compression strain: approximately 3%, volume ratio: 25%) is formed while supplying material amount equivalent to approximately double molecular layer at a substrate temperature of 460° C. In this case, the lattice constant of the semiconductor crystal constituting the quantum dots 4 is larger than the lattice constant of the semiconductor crystal constituting the lower barrier layer 3 and a predetermined difference resides therebetween. Therefore, island-like InAs quantum dots 4 are formed in a S-K (Stranski-Krastanow) mode growth, which appears at the initial stage of strain heteroepitaxial growth.

Then, the strain InGaAsP side barrier layer 5 of, for example, $In_{0.710}Ga_{0.290}As_{0.327}P_{0.673}$ semiconductor mixed crystal (third semiconductor crystal, lattice constant: 0.58113 nm, tensile strain: 1%, volume ratio: 75%) is formed while supply material amount equivalent to thickness of 1.5 nm so as to bury the quantum dots 4.

After forming the side barrier layer 5 as described above, at a substrate temperature of 500° C., a temperature anneal is made to a substrate temperature of 460° C. Owing to this, the top portion of the quantum dots 4 is formed flatly, and the height of the quantum dots 4 becomes substantially equal to the thickness of the side barrier layer 5. In this manner as described above, the quantum dot layer 8 including the quantum dots 4 with flattened surface and the side barrier layer 5 is formed.

Here, the lattice constant of the semiconductor crystal constituting the side barrier layer 5 is smaller than the lattice constant of the semiconductor crystal constituting the lower barrier layer 3. Therefore, the difference between the values of the first lattice constant and the second lattice constant has a sign opposite to that of the difference between the values of first lattice constant and the third lattice constant. And, the value of the lattice constant (first lattice constant) of the semiconductor crystal constituting the barrier layer 3 becomes equal to the average value of the value of the lattice constant (second lattice constant) of the semiconductor crystal constituting the quantum dots 4 and the value of the lattice constant (third lattice constant) of the semiconductor crystal constituting the side barrier layer 5. Particularly, the integrated value of the difference between the values of the first lattice constant and the second lattice constant and the volume ratio of the quantum dots 4 with respect to the volume of the quantum dot layer 8 becomes equal to the integrated value of the difference between the values of the first lattice constant and the third lattice constant and the volume ratio of the side barrier layer 5 with respect to the volume of the quantum dot layer 8. Owing to this, the lattices matching of the barrier layer 3 and the quantum dot layer 8 is ensured.

On the quantum dot layer 8 formed as described above, the upper barrier layer 7 of 100 nm in thickness is formed in contact with the top portion of the quantum dots 4.

Thus, the active layer 6 having such a structure that the quantum dot layer 8 is sandwiched between the lower barrier layer 3 and the upper barrier layer 7 is formed. Here, although a single active layer 6 having the structure in which the quantum dot layer 8 is sandwiched between the upper and the lower barrier layers 3 and 7 is formed, the active layers 6 having the same structure may be repeatedly stuck.

After that, for example, contact layer, electrodes and the like are formed.

Therefore, according to the quantum dot SOA in accordance with the first embodiment, the crystallinity of the quantum dot layer 8 including the quantum dots 4 (and entire of active layer 6 also) can be improved resulting in such an advantage that the luminescence intensity can be increased.

Figure 2:
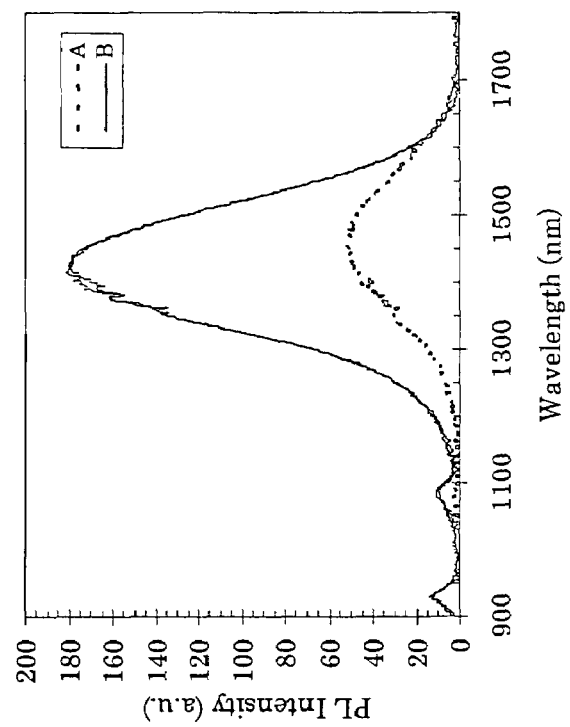
FIG. 2 is a diagram for illustrating the effect of the semiconductor device in accordance with the first embodiment of the invention.

FIG. 2 shows measurement results (PL spectrum) of the photo-luminescence intensity (PL intensity) in a quantum dot SOA having the above-described device structure.

The broken line A in FIG. 2 indicates the photo-luminescence intensity of the case where the side barrier layer and the barrier layers are formed of $In_{0.850}Ga_{0.150}As_{0.327}P_{0.673}$ semiconductor mixed crystal. The solid line B indicates the photo-luminescence intensity in the case where the barrier layers are formed of $In_{0.850}Ga_{0.150}As_{0.327}P_{0.673}$ semiconductor mixed crystal and the side barrier layer is formed of $In_{0.710}Ga_{0.290}As_{0.327}P_{0.673}$ semiconductor mixed crystal, which has the lattice constant smaller than the lattice constant of the barrier layers, and the lattice constant of the quantum dot layer (and entire active layer also) including the side barrier layer and the quantum dots is equal to the lattice constant of the barrier layers (or InP substrate). In the both cases of broken line A and the solid line B, the quantum dots are formed of InAs semiconductor crystal having the lattice constant larger than the lattice constant of the barrier layers.

As shown with the solid line B and the broken line A in FIG. 2, it is demonstrated that, when the semiconductor mixed crystal of $In_{0.710}Ga_{0.290}As_{0.327}P_{0.673}$ is used for the side barrier layer, the recombination photo-luminescence intensity from the quantum dots increases larger than the case where the semiconductor mixed crystal of $In_{0.850}Ga_{0.150}As_{0.327}P_{0.673}$ is used for the side barrier layer. This means the following fact; i.e., in the case where the semiconductor mixed crystal of $In_{0.710}Ga_{0.290}As_{0.327}P_{0.673}$ is used for the side barrier layer (solid line B in FIG. 2), the crystallinity of the quantum dot layer (active layer) is better than the case where semiconductor mixed crystal of $In_{0.850}Ga_{0.150}As_{0.327}P_{0.673}$ is used for the side barrier layer (broken line A in FIG. 2).

Second Embodiment

Next, a semiconductor device in accordance with a second embodiment of the invention will be described with reference to FIG. 3.

The semiconductor device in accordance with the second embodiment is different from the first embodiment in a point that a plurality of quantum dot layers is provided.

Figure 3:
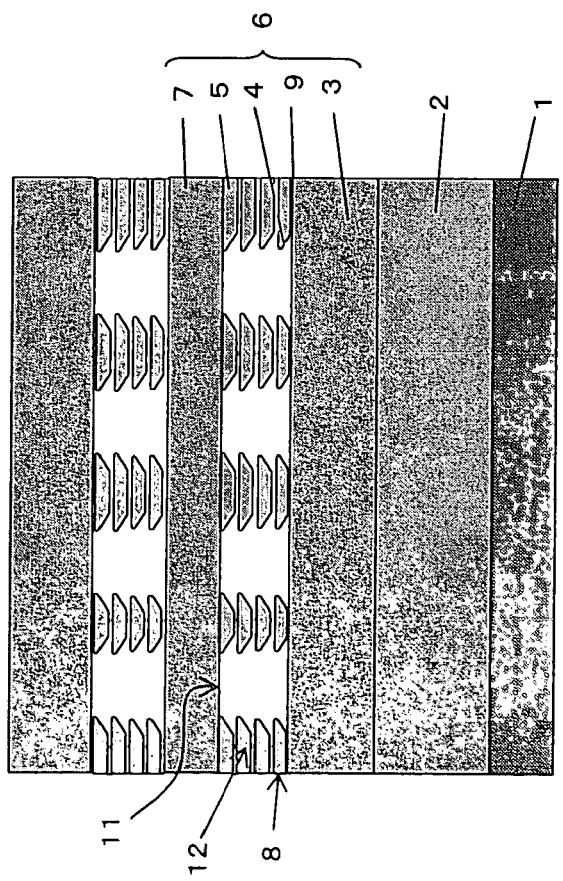
FIG. 3 is a sectional view schematically showing a structure of a semiconductor device in accordance with a second embodiment of the invention.

That is, the quantum dot SOA in accordance with the second embodiment is provided with a plurality of quantum dot layers 8 as shown in FIG. 3, and in the plurality of quantum dot layers 8, a quantum dots 4 constituting one layer is stuck in contact with a quantum dots 4 constituting another neighboring layer.

The quantum dot SOA is comprised of a semiconductor substrate (here, InP substrate) 1 and an active layer 6 formed on the semiconductor substrate 1 being interposed by a buffer layer (here, InP layer) 2 as shown in FIG. 3.

The active layer 6 has such a structure that the plurality of quantum dot layers 8 are stuck and sandwiched by the upper and lower barrier layers 3 and 7. That is, the active layer 6 includes barrier layers 3 and 7, a plurality of quantum dot stacking body (lamination) 11 and a side barrier layer stacking body (lamination) 12.

Like the first embodiment, the quantum dot layer 8 comprises a plurality of quantum dots 4 and a side barrier layer 5 formed in contact with the side faces of the plurality of quantum dots 4.

The quantum dot stacking body 11 has such a structure that plural quantum dots 4 are directly stuck one another vertically and joined with each other in a quantum mechanics in the crystal growth direction. Therefore, the entirely quantum dot stacking body 11 can be understood as one quantum dot. Also, the side barrier layer stacking body 12 has such a structure that plural side barrier layers 5 are stuck vertically, and the entire thereof can be understood as one side barrier layer. Therefore, the entire of a plurality of quantum dot layers 8 can be understood as one quantum dot layer. In this case, the upper surface of one quantum dot layer is in contact with the upper barrier layer 7, and the lower surface thereof is in contact with the lower barrier layer 3; thus the height of the quantum dots and the thickness of the side barrier layer are substantially equal to each other.

Particularly, the quantum dot layer 8 constituting the quantum dot stacking body 11 and side barrier layer stacking body 12 is the same as that in the first embodiment, and has a satisfactorily crystallinity. Therefore, the quantum dot layer 8 can be easily stuck one another and the number of stuck layers can be increased. Further, in the plurality of quantum dot layers 8, since the lattices matching is ensured, the crystallinity of the entire active layer 6 formed with stuck quantum dot layers 8 can be achieved satisfactorily. Furthermore, the quantum dot stacking body 11 is formed by stacking flat quantum dots 4, substantial aspect ratio (height/diameter) of the quantum dots 4 can be made larger (for example, larger than 0.5), the polarized wave dependency can be improved.

Furthermore, the plurality of quantum dot laminations 11 are formed by directly stacking the quantum dots 4 vertically, and the side barrier layers 5 (side barrier layer lamination 12) having a strain on the respective side faces are formed being in contact with each other. The strain generated in the quantum dots 4 in the crystal growth direction can be effectively controlled with the side barrier layer 5 only and the polarization dependency can be improved.

The above will be described further in detail.

That is, in order to improve the polarization dependency, it is conceivable that a strain is given to the barrier layer in contact with the quantum dots to allow the tensile force (or compressive force) to act on the quantum dots. However, when a large strain is given to the barrier layer, the crystallinity of the quantum dot layer (and the active layer also) formed of the quantum dots and the side barrier layer is degraded.

Particularly, for example, as disclosed in the Japanese Patent Laid-Open (Kokai) No. 2004-111710, when a barrier layer is formed at the upper side (here, since a plurality of barrier layers including quantum dots are stuck, between the upper and lower quantum dots) of the quantum dots, a compressive force (or tensile force) acts on the upper face side of the quantum dots resulting in an undesired effect on the view of improving the polarization dependency.

On the other hand, generally, since the quantum dots formed in a manner of self-organization have a flat configuration, the area of the side faces is smaller than the area of the lower surface. In the quantum dots having such a configuration, in order to improve the polarized wave dependency, it is conceivable that, a large strain is given to the side barrier layer only in contact with the side faces of the quantum dots to allow the tensile force (or compressive force) of satisfactory large to act on the side faces of the quantum dots. However, when a large strain is given, the crystallinity of the quantum dot layer (and the active layer also) formed of the quantum dots and the side barrier layer is degraded.

Therefore, in order to improve the polarization dependency, it is desired that, while preventing a large strain from being given to the side barrier layer, the tensile force (or compressive force) is allowed to effectively act on side faces of the quantum dots so that the area size of the side faces of the quantum dots in contact with the side barrier layer is closer to the area size of the lower surface with which the barrier layer is in contact.

In order to achieve this, in the second embodiment, the polarization dependency is improved in the following manner. A strain (for example, 1%) is given to the side barrier layer 5 to an extent that the crystallinity of the quantum dot layer 8 (and the active layer 6 also) is not degraded and the plurality of quantum dot layers 8 are stuck; thereby quantum dot staking body 11 and the side barrier layer staking body 12 are formed so that the area of the side faces of the quantum dots 4 (quantum dot staking body 11), with which the side barrier layer 5 (side barrier layer staking body 12) is in contact with, is closer to the area of the lower surface of the quantum dots 4 with which the lower barrier layer 3 is in contact with. Therefore, the strain generated in the quantum dots 4 can be effectively controlled and the polarization dependency can be improved. Also, by giving a strain to the side barrier layer 5 constituting the quantum dot layer 8, the polarization independency can be achieved with fewer stuck layers than the case where the strain is not given to the side barrier layer 5.

Since the configuration is the same as the first embodiment, the detailed description thereof will be omitted.

Next, the manufacturing method of the quantum dot SOA in accordance with the second embodiment will be described.

First of all, the process up to the point the island-like InAs quantum dots 4 are formed as shown in FIG. 3 is the same as the case of the first embodiment. In the second embodiment, on the surface where the quantum dots 4 are allowed to grow in S-K mode, an extremely thin InAs layer, which is called as wetting layer 9 is formed.

Then, in the same manner as the first embodiment, after forming the side barrier layer 5, a temperature annealing is carried out so that the height of the quantum dots 4 is substantially equal to the thickness of the side barrier layer 5. Thus, the quantum dot layer 8 including the quantum dots 4 and the side barrier layer 5, of which surface is flattened, is formed.

Then, on the quantum dot layer 8 formed as described above, after forming an island-like InAs quantum dots 4 and the side barrier layer 5 in the same manner as the above, a temperature annealing is carried out to form the quantum dot layer 8 of which surface is flattened. After that, by repeating the process to form such quantum dot layers 8, a plurality of the quantum dot layers 8 are stuck (for example, 10 layers; in FIG. 3, for the convenience of description, a quantum dot layer stuck to 4 layers is shown).

When quantum dots 4 are formed on the quantum dot layer 8, the quantum dots 4 are easily formed just above the quantum dots 4 constituting the quantum dot layer 8 and the quantum dots 4 in the upper and lower layers are vertically joined with each other. Thus, the quantum dots 4 are formed on the quantum dots 4 and the quantum dot stacking body 11 having the stuck quantum dots 4 is formed. As a result, the side barrier layer 5 is formed on the side barrier layer 5 and the side barrier layer stacking body 12 having the stuck side barrier layers 5 is also formed.

Then, after stacking a plurality of quantum dot layers 8, a barrier layer 7 of 100 nm in thickness is formed thereon in contact with the top portion of the quantum dots 4 constituting the uppermost quantum dot layer 8. Thus, the active layer 6 having such a structure that the plurality of quantum dot layers 8 are sandwiched between the lower barrier layer 3 and the upper barrier layer 7 is formed. In this case, in the quantum dots 4, the upper surface thereof is in contact with the upper barrier layer 7, and the lower surface thereof is in contact with the lower barrier layer 3.

In the second embodiment, the processes up to this is repeated again to stuck with the active layer 6 on the active layer 6 formed as described above to form the quantum dot SOA having a double layered structure of the active layers 6 having the same structure as shown in FIG. 3. In the second embodiment, the active layer 6 has the double-layered structure, but the number of the layers is not limited thereto.

After that, for example, a contact layer, electrodes and the like are formed.

Therefore, according to the quantum dot SOA in accordance with the second embodiment, same as the case of the first embodiment, the crystallinity of the quantum dot layer 8 (and the entire active layer 6) including the quantum dots 4 can be improved, and accordingly such an advantage that the photo-luminescence intensity is increased is obtained.

Particularly, in the second embodiment, the quantum dots 4 are directly stuck on the quantum dots 4 to increase the substantial height of the quantum dots and the size of the area of the side faces of the quantum dots 4 with which the side barrier layer 5 is in contact is satisfactorily ensured; thereby the strain generated on the quantum dots 4 is effectively controlled. Thus, such an advantage that the polarization dependency is improved.

In the second embodiment, the wetting layer 9 is formed, but the wetting layer 9 may not be formed.

Third Embodiment

Next, a semiconductor device in accordance with a third embodiment of the present invention will be described with reference to FIG. 4.

The semiconductor device in accordance with the third embodiment is a buried waveguide quantum dot SOA, which has the same active layer structure as that of the quantum dot SOA in accordance with the second embodiment.

Figure 4:
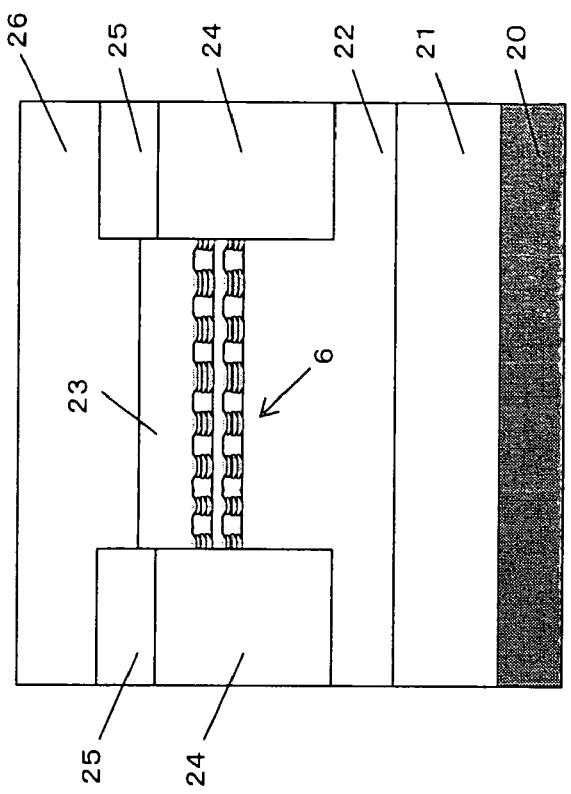
FIG. 4 is a sectional view schematically showing a structure of a semiconductor device in accordance with a third embodiment of the invention.

The buried waveguide quantum dot SOA is configured including a semiconductor substrate (here, n-InP substrate) 20, a buffer layer (here, n-InP layer) 21, a lower cladding layer (here, n-InP layer) 22, an active layer 6 (here, including InGaAsP barrier layer 5 and InAs quantum dots 4), an upper cladding layer (here, p-InP layer) 23, current blocking layers 24 and 25 (here, p-InP layer and n-InP layer) and a contact layer (here, p-InP layer) 26 as shown in FIG. 4.

The active layer 6 is configured in the same manner as the active layer of the quantum dot SOA in accordance with the second embodiment.

Although not shown in the figure, the upper surface and the lower surface are formed with an electrode respectively, and on the both ends, an AR (Anti-Reflection) coating film is formed respectively.

Then, the forming method of the buried waveguide quantum dot SOA in accordance with the third embodiment will be described.

First of all, on the n-InP substrate 20 having (001) plane direction, the n-InP buffer layer 21 and the n-InP lower cladding layer 22 are formed in this order as shown in FIG. 4. The n-InP substrate 20, the n-InP buffer layer 21 and the n-InP lower cladding layer 22 are doped so that the carrier density is, for example, $1\times10^{18} cm^{-3}$.

Then, on the n-InP cladding 22 layer, in the same manner as the second embodiment, the active layer 6 including the InGaAsP barrier layer 5 and the InAs quantum dots 4 are formed.

Then, the p-InP upper cladding layer 23 is formed on the active layer 6.

And then, the stuck n-InP lower cladding layer 22, the active layer 6 and the p-InP upper cladding layer 23 is processed by means of, for example, etching to form a mesa structure.

After forming the p-InP current blocking layer 24 and the n-InP current blocking layer 25 in this order, so that the opposite sides of the mesa structure including the n-InP lower cladding layer 22, the active layer 6 and the p-InP upper cladding layer 23 are buried, the p-InP contact layer 26 is formed on the mesa structure and the n-InP current blocking layer 25.

After that, the electrodes are formed on the upper surface and the lower surface, and on the both ends of the mesa structure, an AR coating film (anti-reflection film) is formed.

Therefore, according to the buried waveguide quantum dot SOA according to the third embodiment, the crystallinity of the quantum dot layer 8 (including the entire active layer 6) including the quantum dots 4 is improved. Thus, such an advantage that the photo-luminescence intensity is increased is obtained.

Particularly, in the third embodiment, the quantum dots 4 are directly stuck on the quantum dots 4 to increase the effective height of the quantum dots 4, and thereby the size of the area of the side faces of the quantum dots 4 in contact with the side barrier layer 5 is satisfactorily ensured. Owing to this, the strain generated on the quantum dots 4 can be effectively controlled. Thus, such an advantage that the polarized wave dependency can be improved.

In the above-described embodiments, an example in which the present invention is applied to the case where the barrier layers and the side barrier layer are configured of a semiconductor crystal of InGaAsP is described respectively. However, the present invention is not limited to the above case, but is applicable to the following cases; i.e., the barrier layers and the side barrier layer are configured of a semiconductor crystal of III-V compound semiconductor mixed crystal, which includes, for example, In and Ga such as InGaAs, InAlGaAs, InAlGaP, GaInNAs and the like.

Also, in the above embodiments, an example in which the present invention is applied to the case where the semiconductor substrate is the InP substrate, which has a (001) plane direction, is described respectively. However, the present invention is not limited to the above example, but is applicable to the case where the semiconductor substrate is formed of another semiconductor substrate such as InP substrate, GaAs substrate, which have, for example, (111) plane direction or (110) plane direction.

Further, in the above embodiments, an example in which the present invention is applied to the case where the quantum dots are formed of the InAs semiconductor crystal is described respectively. However, the present invention is not limited to the above example, but is applicable to the case where the quantum dots are formed of a semiconductor crystal of, for example, InGaAsP, GaInNAs, GaAs or the like.

Furthermore, in the above embodiments, the description has been made while taking the buried waveguide quantum dot SOA as an example. However, the present invention is not limited to the above example, but is applicable to a ridge waveguide quantum dot SOA.

Still further, in the above embodiments, an example of the quantum dot SOA as the semiconductor device has been described. However, the present invention is not limited to the above, but is widely applicable to semiconductor devices using the quantum dots (quantum dot semiconductor device, optical semiconductor device) such as SOAs, which have different structure, semiconductor optical modulator, semiconductor lasers.

The present invention is not limited to the above-described embodiments, but may be variously modified within a range of the spirit of the present invention.

What is claimed is:

1. A semiconductor device, comprising:
   a lower barrier layer of a semiconductor crystal having a first lattice constant;
   a quantum dot layer formed on the lower barrier layer including a plurality of quantum dots of a semiconductor crystal having a second lattice constant and a side barrier layer of a semiconductor crystal having a third lattice constant formed in contact with the side faces of the plurality of quantum dots; and
   an upper barrier layer of a semiconductor crystal having the first lattice constant formed in contact with the upper face of the plurality of quantum dots;
   wherein said plurality of quantum dots are directly stuck on one another vertically; and
   wherein, the lower and upper barrier layer, the quantum dots and the side barrier layer are configured so that the difference between the values of the first lattice constant and the second lattice constant has a sign opposite to that of the difference between the values of the first lattice constant and the third lattice constant.

2. The semiconductor device according to claim 1, wherein the barrier layer, the quantum dots and the side barrier layer are configured so that the value of the first lattice constant is equal to the average value of the values of the second lattice constant and the third lattice constant.

3. The semiconductor device according to claim 1, wherein the barrier layer, the quantum dots and the side barrier layer are configured so that a product value of the difference between the values of the first lattice constant and the second lattice constant and the volume ratio of the quantum dots with respect to the volume of the quantum dot layer is equal to a product value of the difference between the values of the first lattice constant and the third lattice constant and the volume ratio of the side barrier layer with respect to the volume of the quantum dot layer.

4. The semiconductor device according to claim 1, wherein the semiconductor crystals forming the barrier layer and the side barrier layer are a III-V compound semiconductor mixed crystal including In and Ga respectively.

5. The semiconductor device according to claim 4, wherein the concentration of In or Ga in the semiconductor crystal forming the barrier layer and the side barrier layer in the area in the vicinity of the quantum dots is higher than that in the area other than that area.

* * * * *